(12) United States Patent
Katayama

(10) Patent No.: US 7,252,358 B2
(45) Date of Patent: Aug. 7, 2007

(54) RECORDING APPARATUS

(75) Inventor: Naoki Katayama, Kariya (JP)

(73) Assignee: Brother Kogyo Kabushiki Kaisha, Nagoya-Shi, Aichi-Ken (JP)

( * ) Notice: Subject to any disclaimer, the term of this patent is extended or adjusted under 35 U.S.C. 154(b) by 175 days.

(21) Appl. No.: 10/811,179

(22) Filed: Mar. 26, 2004

(65) Prior Publication Data

US 2004/0227788 A1  Nov. 18, 2004

(30) Foreign Application Priority Data

Mar. 28, 2003  (JP) .............................. 2003-089882
Mar. 28, 2003  (JP) .............................. 2003-089899

(51) Int. Cl.
*B41J 29/377* (2006.01)

(52) U.S. Cl. ...................................................... 347/18
(58) Field of Classification Search .................. 347/18
See application file for complete search history.

(56) References Cited

U.S. PATENT DOCUMENTS 5,428,373 A *  6/1995  Shiraishi et al. ............ 347/203
5,818,499 A * 10/1998  Orlicki et al. ............... 347/237
6,095,701 A *  8/2000  Sattler ..................... 400/120.17
6,305,784 B1  10/2001  Hino
6,386,672 B1 *  5/2002  Kimura et al. ................ 347/18
2002/0105567 A1 *  8/2002  Yamada et al. ................ 347/87

FOREIGN PATENT DOCUMENTS

JP       11010850       10/2001
JP      2002240306       8/2002

* cited by examiner

Primary Examiner—Stephen Meier
Assistant Examiner—Jason Uhlenhake
(74) Attorney, Agent, or Firm—Day Pitney LLP

(57) ABSTRACT

A recording apparatus comprising: a printing head which has a plurality of recording elements and performs recording on the recording medium; a head holder which holds the printing head; a flexible wiring board comprising a flexible insulating band and a plurality of conductive wires and a driver element for actuating the printing head, which are provided on the flexible insulating band; and a heatsink for releasing heat generated by the driver element, wherein the heatsink is disposed between the flexible wiring board and the head holder.

15 Claims, 9 Drawing Sheets

RECORDING APPARATUS

The present application is based on Japanese Patent Application Nos. 2003-089882 and 2003-089899 both filed on Mar. 28, 2003, the contents of which are incorporated herein by reference.

BACKGROUND OF THE INVENTION

1. Field of the Invention

The present invention relates in general to a recording apparatus. In particular, the invention relates to an ink jet recording apparatus having a printing head to record a desired image on a recording medium, a driver element for driving the printing head, and a flexible wiring board for transmitting signals from the driver element to the printing head.

2. Discussion of Related Art

There is conventionally known an ink-jet recording apparatus for recording a desired image on a recording medium such as a sheet of paper, which apparatus is adapted to eject, onto the recording medium, a droplet of ink through a plurality of nozzles formed in a printing head so that the desired image is formed on the recording medium. On the ink-jet recording apparatus, there is mounted an ink carriage which is reciprocable in a direction along a printing area of the printing medium. A head holder is mounted on the ink carriage. The printing head, a circuit board for supplying drive signals to the printing head, and a flexible wiring board for connecting the printing head and the circuit board are disposed on the head holder. Such an ink-jet recording apparatus is disclosed in U.S. Pat. No. 6,305,784, for example.

Due to the existing tendency that the number of the nozzles increases and density thereof also increases, wiring between a driver IC chip as the driver element generating drive signals and a printing head becomes thinner and denser, making the drive signals on the wiring susceptible to noise. Further, the number of interconnections between wires of the circuit board and wires of the flexible wiring board increases. There is disclosed, in U.S. patent application No. 2002-0105567, an arrangement for dealing with the above-described drawbacks, where driver IC chips are mounted on respective flexible wiring boards to have each driver IC chip as close as possible to the corresponding printing head.

With the increase in the number of nozzles, heat generated by the driver IC chips increases. To release this heat, the driver IC chips are pressed by an elastic member such as a sponge member, onto a cover plate which covers the flexible wiring board, so that the cover plate serves as a heatsink. The above-mentioned U.S. patent application No. 2002-0105567 discloses this arrangement, too.

On the other hand, there is a request to further increase the number of the nozzles. However, such an increase leads to a larger amount of heat generated at the driver IC chips, and accordingly requires enlarging the heatsink. In addition, a condenser preventing an excessive voltage drop and a connector connecting a control portion in a main body of a printer including the recording apparatus and the circuit board, which are essentially disposed on the circuit board, must be enlarged if the number of nozzles increases. Since the circuit board is positioned adjacent to the flexible wiring board, the increasing the sizes of the heatsink, condenser and connector leads to mutual intervention of the three members. Further, in a case where the head holder has a small size, the size of the heatsink is limited and therefore the heat generated at the driver IC chips can not be effectively released. In this case, performance of the driver IC chips may be deteriorated, or the driver IC chips may be damaged.

Furthermore, according to the recording apparatus disclosed in the U.S. Patent Application indicated above, a foreign material may be introduced between the heatsink and one of the driver IC chips during an assembly process of the apparatus. If such introduction of a foreign material occurs, the driver IC chip may be damaged, since the driver IC chip is pressed onto the heatsink by the elastic member and subjected to a local pressure due to the presence of the foreign material. In addition, the foreign material introduced between the heatsink and the driver IC chip deteriorates close contact between the heatsink and the driver IC chip, lowering heat conduction from the driver IC chip to the heatsink. Further, since a surface of the driver IC chip functions as a ground electrode, when an electrical noise which deteriorates print quality occurs at one of the driver IC chips, the noise is propagated to other driver IC chips through the heatsink.

SUMMARY OF THE INVENTION

The present invention was developed in the light of the situations described above, and therefore it is an object of the invention to provide a recording apparatus capable of efficiently releasing heat generated at the driver element of the printing head, which driver element is disposed on the flexible wiring board, while preventing the driver element from being damaged even if a foreign material is introduced between the heatsink and the driver element where a degree of closeness of the contact between the heatsink and the driver element is enhanced.

The object indicated above may be achieved according to a first preferred form of the present invention, which provides a recording apparatus comprising: a printing head which has a plurality of recording elements and performs recording on the recording medium; a head holder which holds the printing head; a flexible wiring board which is disposed on the outer side of the head holder and comprises: a flexible insulating band; a plurality of conductive wires; and a driver element for actuating the printing head, the conductive wires and the driver element being disposed on the flexible insulating band; and a heatsink which is disposed between the flexible wiring board and the head holder and releases heat generated by the driver element.

In the recording apparatus according to the above-indicated first preferred form of the invention, the flexible wiring board having the driver element for driving the printing head is disposed on the outer side of the head holder, while the heatsink is disposed between the flexible wiring board and the head holder. Accordingly, it is made easy for the heatsink disposed between the flexible wiring board and the head holder to extend to have a sufficient surface area for releasing outward the heat generated by the driver element, thereby making it possible to inhibit a rapid rise in temperature of the driver element.

The object may be achieved according to a second preferred form of the invention, which provides the recording apparatus according to the first preferred form of the invention, wherein the heatsink is directly held in close contact with a surface of the flexible wiring board which surface is opposite to another surface of the flexible wiring board on which the driver element is disposed, at a position corresponding to a position in the another surface where the driver element is disposed.

In the recording apparatus according to the second preferred form of the invention, the heatsink is held in close contact with the surface of the flexible wiring board which surface is opposite to the another surface on which the driver element is disposed, at the position corresponding to the position in the another surface where the driver element is disposed. Since the flexible wiring board is an insulating body having a flexibility, even in the case where a foreign material is introduced between respective contact portions of the heatsink and the flexible wiring board which are in close contact with each other, the foreign material sinks into or sticks in the surface portion of the flexible wiring board, holding the heatsink in close contact with the surface of the flexible wiring board which surface is opposite to the surface on which the driver element is disposed. Accordingly, the driver element is not subjected to a local force which may damage the driver element, and a high heat conductivity is achieved. It is noted that the same advantages can be obtained even if a member is interposed between the heatsink and the flexible wiring board.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Referring to the accompanying drawings, there will be described preferred embodiments of the present invention.

Figure 1:
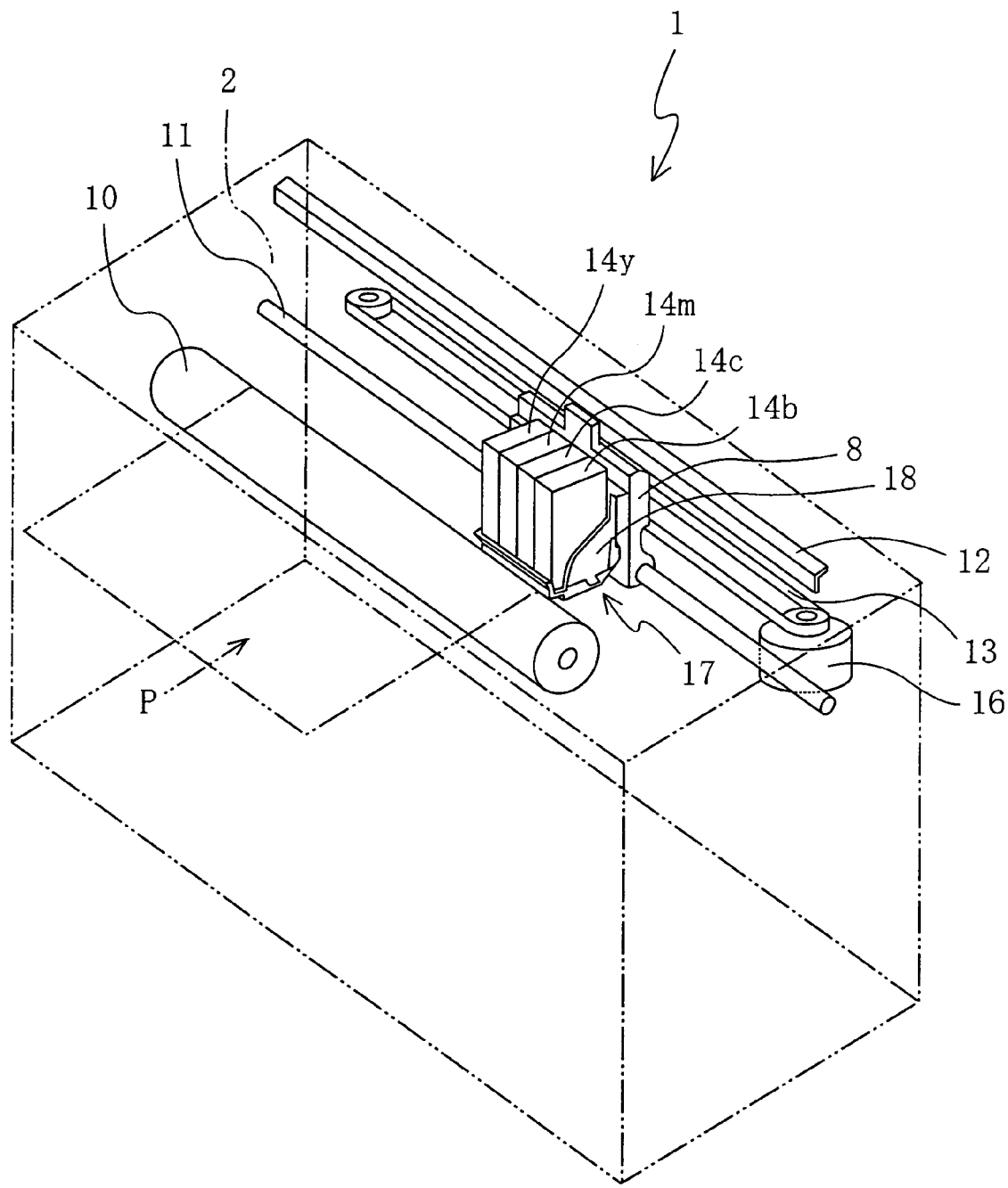
FIG. 1 is a perspective view of internal structure of an ink jet printer according to a first embodiment of the present.

Referring first to FIG. 1, there will be first described internal structure of an ink jet printer 1 according to a first embodiment of the present invention. FIG. 1 is a perspective view showing the internal structure of the ink jet printer 1.

As shown in FIG. 1, a carriage 8, which is moved in reciprocation motion in the widthwise direction of a sheet P of paper as the printing medium, is disposed in a housing 2 of the ink jet printer 1. The carriage 8 is slidably supported by a guide rod 11 and a guide member 12 which extend in a longitudinal direction of the housing 2, and is fixed to an endless belt 13 wound around two pulleys and extending in the longitudinal direction of the housing 2. When the endless belt 13 is circulated or driven by a carriage motor 16, the carriage 8 is reciprocated along the guide rod 11, i.e., in a direction parallel to the sheet P.

A head unit 17 having four printing heads 19, 20, 21, 22 (shown in FIG. 2) performing a recording operation such as printing is attached to the carriage 8. The printing heads are ink-jet printing heads which operates to record a desired object by ejecting respective color inks (cyan, magenta, yellow and black) onto the sheet P of paper as the recording medium. Each of the printing heads 19-22 has, on the surface to be opposed to the sheet P, a plurality of nozzle groups 7a-7h (shown in FIG. 2) for ejecting the respective color inks therefrom.

Four ink cartridges 14y, 14m, 14c, 14b for supplying the respective color inks to the nozzle groups 7a-7h are detachably mounted on the head unit 17. In the ink jet printer 1 according to the first embodiment, a platen roller 10 feeding the sheet P of paper is disposed at a position to be opposed to the printing heads 19-22, and is rotated or driven by a line feed motor (not shown) so that the sheet P is fed in a "sheet feeding direction" which is perpendicular to the direction in which the carriage 8 is moved.

Figure 2:
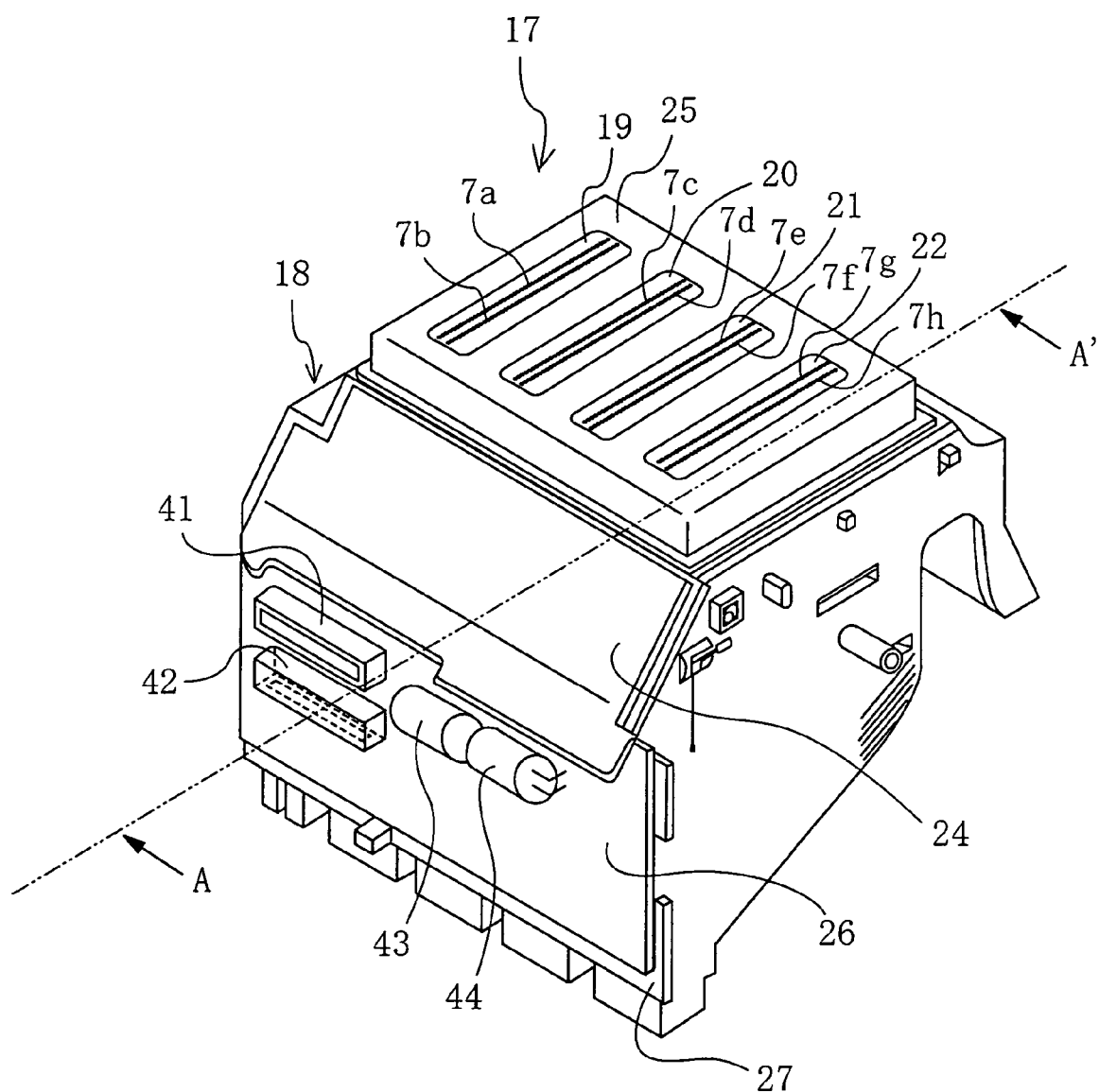
FIG. 2 is a perspective back view of a head in the ink jet printer as seen from its bottom.
Figure 3:
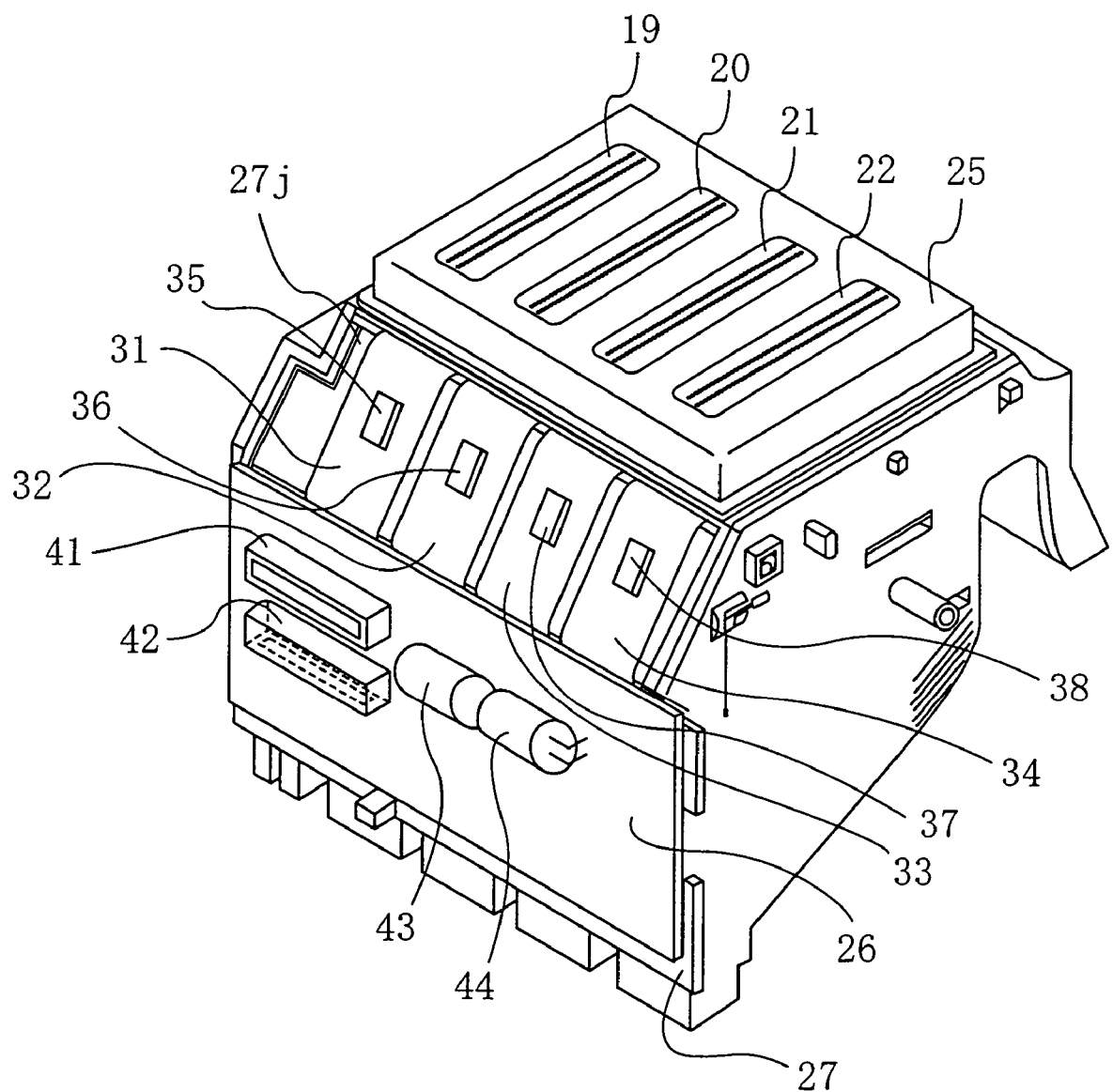
FIG. 3 is a perspective view of the head unit where a cover made of a resin is removed.

Next, there will be explained structure of the head unit 17, by reference to FIGS. 2 and 3. FIG. 2 is a perspective back view of the head unit 17 as seen from its bottom, while FIG. 3 is a perspective view showing the head unit 17 from which a resin cover 24 is removed.

As shown in FIG. 2, the head unit 17 comprises a head holder 18 made of a resin and components attached to the head holder 18, which components consist of: the printing heads 19-22 each of which consists of a plate-type piezoelectric actuator; a metallic head cover 25 having four rectangular openings which correspond to the respective printing heads 19-22 when the metallic head cover 25 is fitted on the printing heads 19-22; a circuit board 26; the heatsink 27; and the resin cover 24. As shown in FIG. 3, the printing heads 19-22 are connected to the circuit board 26 via respective flexible wiring boards 31, 32, 33, 34 each of which includes a slant portion obliquely extending at a blunt angle with both of a bottom wall 18a (shown in FIG. 4) as a first wall of the head holder 18 and a back wall 18b (shown in FIG. 4) as a second wall of the head holder 18, and on each of which an IC chip 35-38 as a driver element is fixed. The resin cover 24 covers these flexible wiring boards 31-34 and fixed to the head holder 18 to protect the boards 31-34. The head holder 18 is held by the carriage 8 as shown in FIG. 1, and can be reciprocated with the carriage 8 along the guide rod 11.

Figure 4:
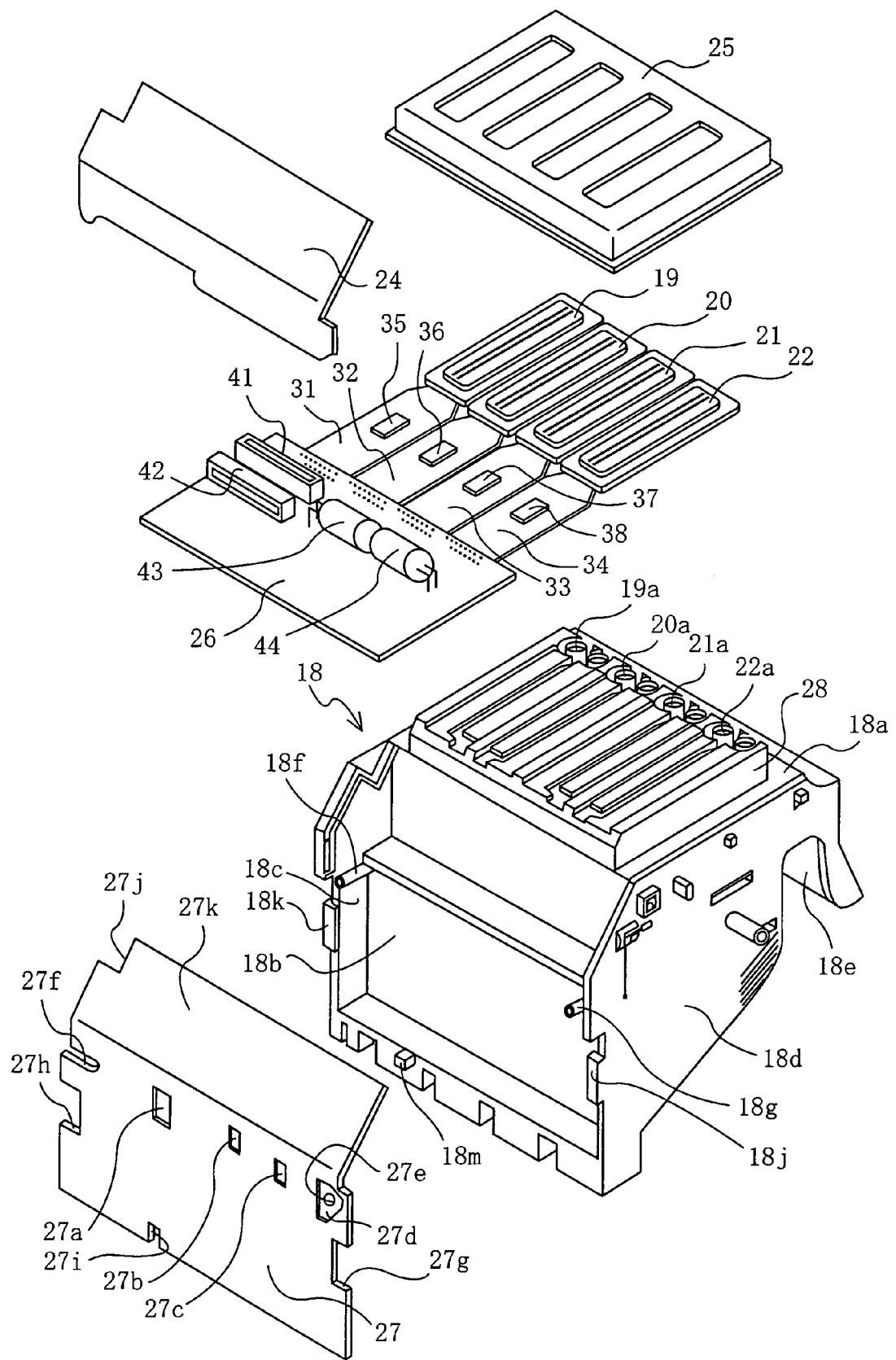
FIG. 4 is an exploded perspective view of the head unit.
Figure 5:
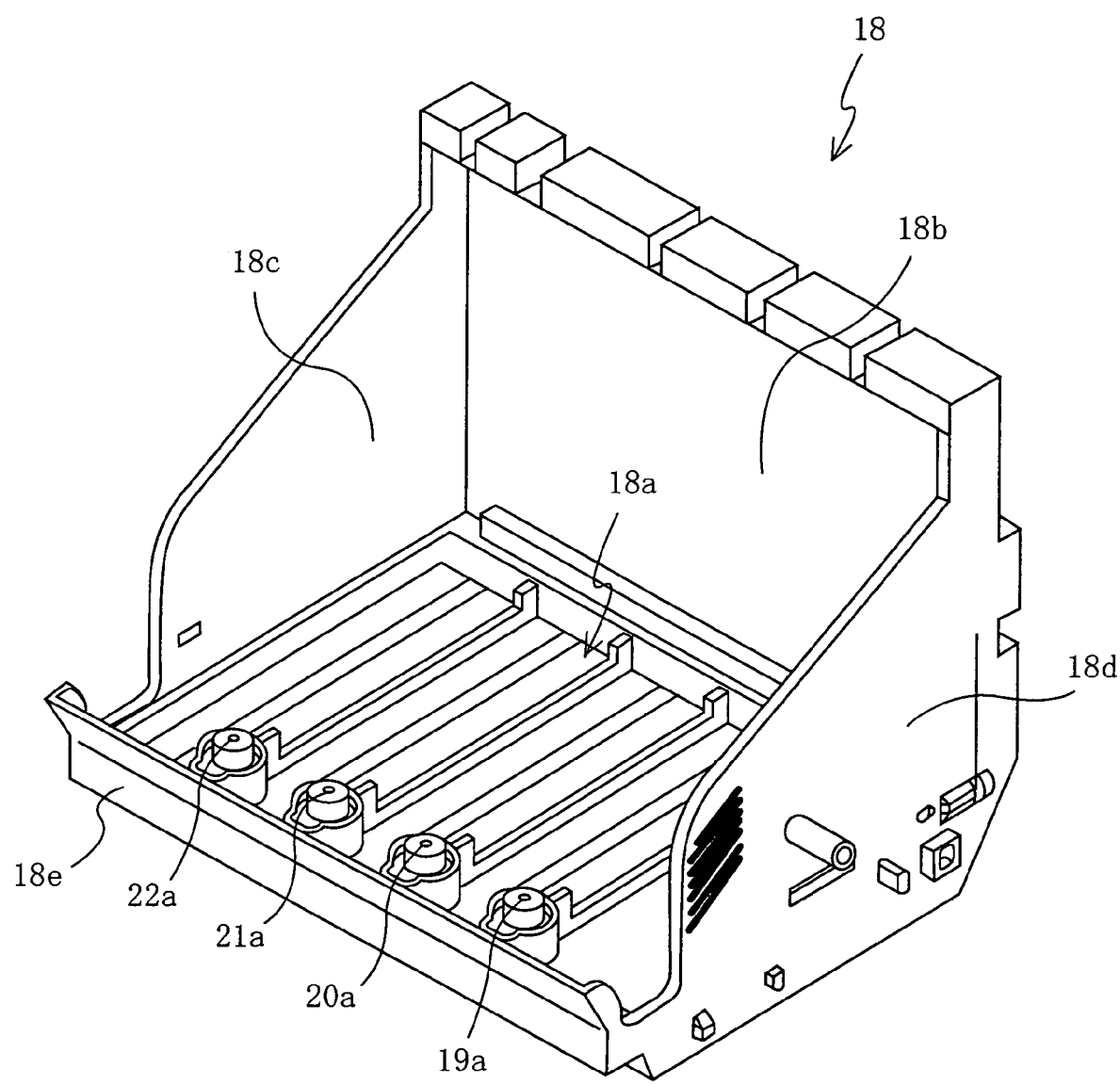
FIG. 5 is a perspective view of a head holder.

By referring to FIGS. 4 and 5, structure of the head holder 18 will be described next. FIG. 4 is an exploded perspective view of the head unit 17, while FIG. 5 is a perspective view of the head holder 18. The head holder 18 is an integral member made of a synthetic resin, and includes the bottom wall 18a, the back wall 18b, a left wall 18c, a right wall 18d and a front wall 18e, as shown in FIGS. 4 and 5. The head holder 18 is open on its upper side, and substantially assumes a box shape. The back, left, right and front walls 18b-18e extend from the bottom wall 18a in a direction opposite to the direction of gravity. The heatsink 27 extends in the same direction (opposite to the direction of gravity) as the back, left, right and front walls 18b-18e extend from the bottom wall 18a, in parallel to the back wall 18b and from the vicinity of a connecting portion where an edge of the bottom wall 18a and an edge of the back wall 18b are connected.

The ink cartridges 14y, 14m, 14c, 14b are detachably mounted on the head holder 18 from the open side of the head holder 18. As shown in FIG. 4, a head holding portion 28 is formed such that the head holding portion 28 protrudes from an outer surface of the bottom wall 18a of the head holder 18. The four printing heads 19-22 for implementing a recording operation by ejecting inks onto the sheet P are bonded to the head holding portion 28 with an adhesive, such that the four printing heads 19-22 are aligned in a row and adjacent to one another. The head cover 25 is fitted on the printing heads 19-22. The heatsink 27 is bonded to an outer surface of the back wall 18b. The circuit board 26 which serves as a relay circuit board connecting the printing heads 19-22 and wiring substrate (not shown) of the carriage 8 is fixed on the outer side of the back wall 18b, with a suitable space (e.g., 3 mm) (as a second clearance) from the heatsink 27.

As shown in FIG. 5, the bottom wall 18a of the head holder 18 has four ink supply orifices 19a, 20a, 21a, 22a which are in communication with respective ink outlets (not shown) of the ink cartridges 14y, 14m, 14c, 14b. Each ink supply orifice 19a-22a formed through the bottom wall 18a is open into the head holding portion 28, and is connected to an ink channel corresponding to the nozzle groups 7a-7h of the printing heads 19-22.

As shown in FIG. 4, a cylindrical boss 18f, 18g is formed at a position near the vertically middle point of right and left edges of the outer surface of the back wall 18b of the head holder 18. The circuit board 26 is screwed (the screws not shown) to the back wall 18b with a space therebetween by utilizing the boss 18f, 18g. At three peripheral portions of the back wall 18b of the head holder 18, projections 18j, 18k, 18m are respectively formed.

The carriage 8 has the above-indicated wiring substrate (not shown) which is connected to a control substrate (not shown) in the housing 2 as a main body of the printer 1, via another flexible wiring board (not shown). A connecting portion (not shown) of the wiring substrate of the carriage 8 is connected to a connector 41 (as shown in FIG. 2) of the circuit board 26 provided to the head holder 18, such that electricity and signals are supplied to the circuit board 26 from the control substrate of the main body via the wiring substrate of the carriage 8.

The printing heads 19-22 are well known and constructed similarly to the printing head as disclosed in the above-described U.S. patent application No. 2002-0105567. More specifically described, each printing head 19-22 comprises: a cavity plate having multiple ink pressure chambers in communication with respective corresponding nozzles of the nozzle groups 7a-7h; and the plate-type piezoelectric actuator having electrodes corresponding to the respective ink pressure chambers. The plate-type piezoelectric actuator is superimposed on the cavity plate. Upon selective application of a drive signal to each electrode, the ink is ejected from a corresponding one nozzle in corresponding nozzle group 7a-7h. Each of the flexible wiring boards 31-34 is constructed similarly to the flexible wiring board well known in the art, namely, constructed such that a plurality of conductive wires are formed on a band of insulating material (e.g., polyimide resin) having flexibility, and each of the conductive wires is connected to suitable one of the electrodes of the piezoelectric actuator and thus fixed on the piezoelectric actuator. The IC chips 35-38 as driver elements are mounted on the surface of the respective flexible wiring boards 31-34 which surface is remote from the heatsink 27. The IC chip 35-38 operates to convert drive waveform signals serially transferred from the control circuit of the main body into parallel signals corresponding to respective electrodes of the piezoelectric actuator as well as into a predetermined voltage, and output the converted signals to the conductive wires connected to the electrodes.

There will be explained structure of the circuit board 26, by reference to FIGS. 3 and 4. The circuit board 26 is formed from a rigid substrate such as one made of a glass epoxy, and on the circuit board 26 are disposed a multiplicity of wires produced from copper thin films, electrolytic condensers 43, 44, and connectors 41, 42.

Figure 6:
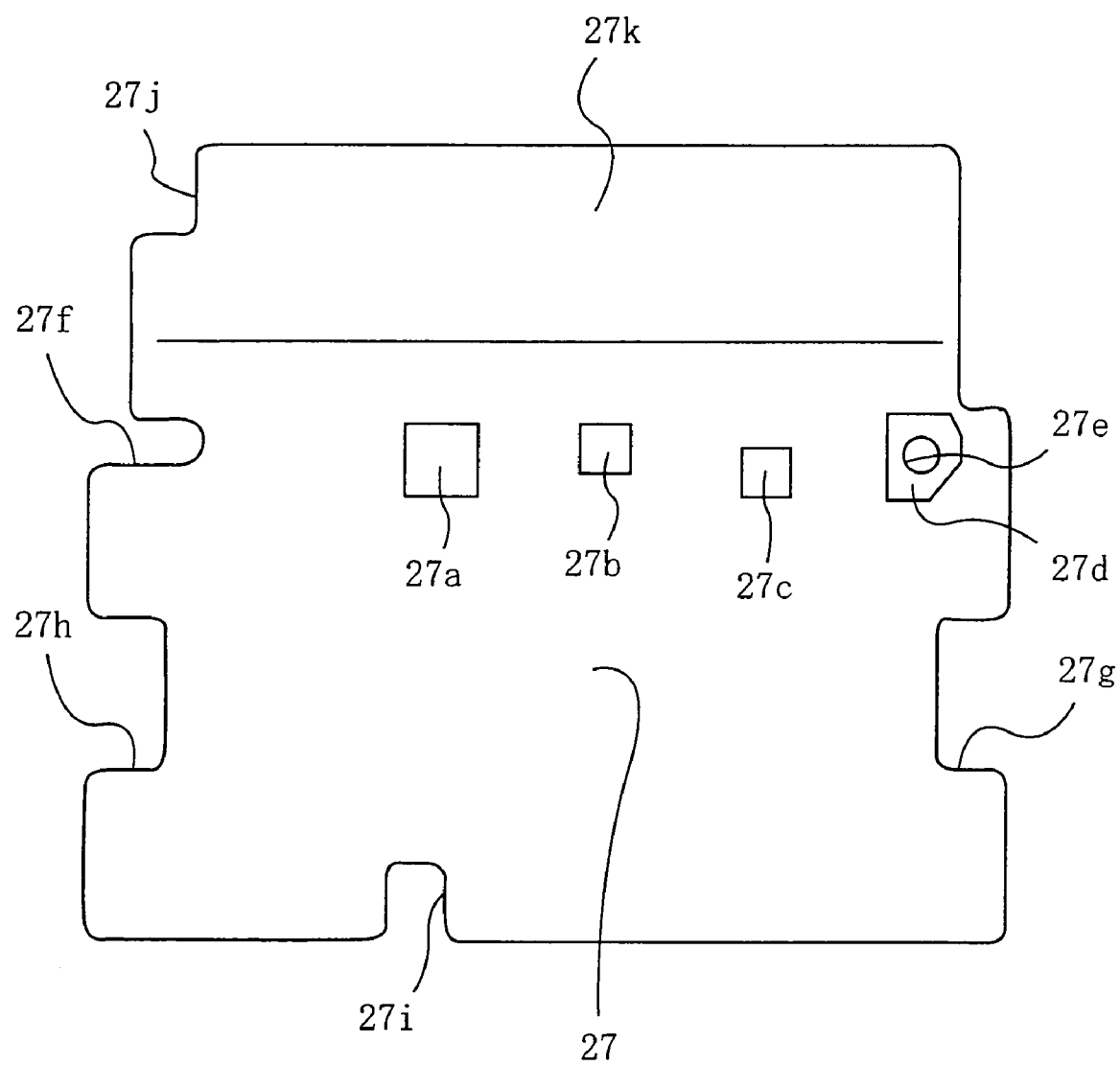
FIG. 6 is a plan view of a heatsink.

By reference to FIGS. 4 and 6, there will be explained structure of the heatsink 27. FIG. 6 is a plan view of the heatsink 27. As shown in FIGS. 4 and 6, the heatsink 27 is formed from an aluminum board which exhibits a high degree of heat release efficiency, and has a substantially rectangular figure as seen parallel to its surface. A part of the heatsink 27 is bent so that the heatsink 27 assumes an elbowed shape as seen from one of its sides to provide: a contact portion 27k as a main portion of the heatsink which is held in pressing contact with the surface of the flexible wiring board 31-34 which surface is opposite to the another surface of the flexible wiring board 31-34 on which the IC chip 35-38 is disposed, at the position corresponding to the position in the another surface on which the. IC chip 35-38 is disposed; and an extending portion which extends substantially parallel to the circuit board 26 from an edge of the contact portion 27k on the side of the circuit board 26. As shown in FIG. 6, recesses 27a, 27b, 27c, 27d are formed on one surface of the heatsink 27 for avoiding interference with legs of electronic components soldered from the outer surface of the circuit board 26 disposed on the outer side of the heatsink 27 and with electronic components disposed on the inner surface of the circuit board 26 opposed to the heatsink 27. A through-hole 27e is formed at the center of the recess 27d. It is noted that the recess 27a, 27b, 27c may be an opening.

As shown in FIG. 6, cutouts 27f, 27g, 27h, 27i, 27j are formed in the peripheral portion or four edge portions of the heatsink 27.

Figure 7:
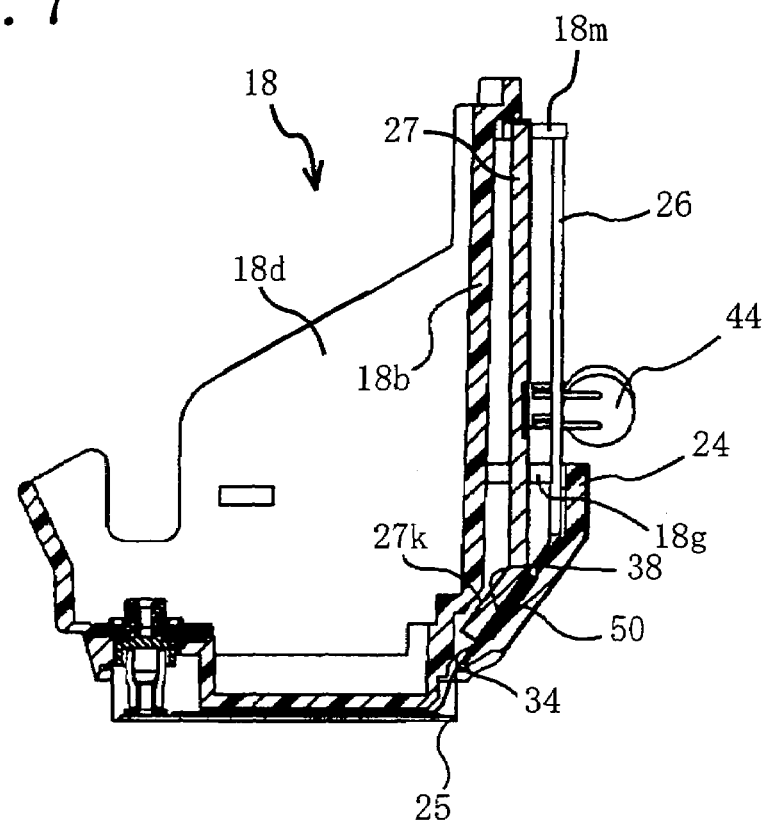
FIG. 7 is a cross sectional view of the head unit along a line A-A' in FIG. 2.
Figure 8:
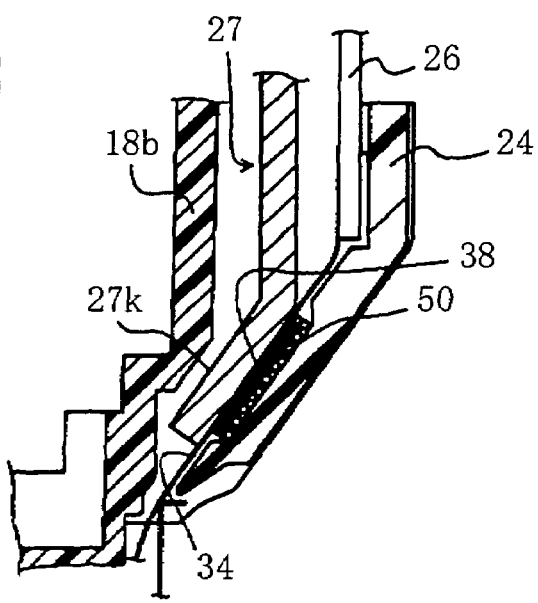
FIG. 8 is an enlarged cross-sectional view of the head unit along the line A-A', showing an IC chip and members around the IC chip.

By reference to FIGS. 2-4, 7 and 8, there will be described in detail how the circuit board 26, heatsink 27 and resin cover 24 are attached to the head holder 18. FIG. 7 is a cross sectional view along a line A-A' in FIG. 2, while FIG. 8 is an enlarged cross-sectional view along the line A-A', showing the IC chip 38 and members around the IC chip 38. To the back wall 18b of the head holder 18, the heatsink 27 is first fixed, as shown in FIGS. 2-4, 7 and 8. Here, the bosses 18f, 18g are fitted through the through-hole 27e and cutout 27f, and projections 18j, 18k, 18m of the head holder 18 are fitted in the cutouts 27g, 27h, 27i. The heatsink 27 is bonded with an adhesive to the vicinity of projections 18j, 18k, 18m. As shown in FIG. 3, there is a spacing between an outer peripheral portion of the contact portion 27k of the heatsink 27 and each wall of the head holder 18, so that heat of the contact portion 27k of the heatsink 27 is not conducted to the head holder 18. Further, there is provided a certain amount of space (e.g., about 3 mm) between the heatsink 27 and the back wall 18b of the head holder 18. Accordingly, in addition to the outward release of the heat from the heatsink 27, this space between the heatsink 27 and the back wall 18b also contributes to release the undesirable heat of the heatsink 27, thereby assuring stable operation of the printing heads 19-22.

As shown in FIG. 3, the printing heads 19-22 are bonded to the head holding portion 28 of the head holder 18, while the circuit board 26 is fixed to the outer surface of the heatsink 27 by screwing the circuit board 26 to the bosses 18f, 18g by using screws (not shown). In this state, the flexible wiring boards 31-34 are held in contact with the contact portion 27k of the heatsink 27, and the circuit board 26 and the heatsink 27 is spaced away from each other with a predetermined distance (the second clearance) therebetween. Then, as shown in FIG. 2, the resin cover 24 is bonded to the head holder 18 such that the resin cover 24 covers the flexible wiring boards 31-34 so as to protect the flexible wiring boards against the damage. As shown in FIG. 8, a sponge member 50, as an elastic member which is held in contact with and presses each IC chip 35-38, is bonded to a back surface of the resin cover 24. When the resin cover 24 is bonded to the head holder 18, the sponge member 50 as the elastic member is compressed and pressed onto the IC chips 35-38.

Thus, the sponge member 50 of the resin cover 24 presses each of the IC chips 35-38, which is in turn pressed toward the contact portion 27k of the heatsink 27 via the flexible wiring board 31-34 made of a thin plate of the polyimide resin exhibiting an excellent heat conduction. Accordingly, the heat generated at the IC chips 35-38 as a result of driving the printing heads 19-22 is conducted to the contact portion 27k of the heatsink 27 via the flexible wiring boards 31-34 and further conducted to the entirety of the heatsink 27, which has an area and a volume each larger than that of the conventional heatsink. Then, the heat is released to the atmosphere. Thus, the heat generated by the IC chips 35-38 can be efficiently conducted to the heatsink 27 and then released. In this regard, it is noted that a portion of the surface of the heatsink 27 to be opposed to the head holder 18, which portion comprises a first area corresponding to each of the IC chip 35-38 and a second area surrounding and adjacent to the first area, is not in contact with the head holder 18. Accordingly, the heat in the highly heated heatsink 27 is not conducted to the head holder 18 but is released into the space between the head holder 18 and the heatsink 27. Further, it is also noted that although the heatsink is generally preferably made of a metal having a high coefficient of thermal conductivity, if the heatsink is made of such a metal and if two or more driver elements (IC chips) are provided to directly contact the heatsink, there could be caused a drawback that, when an electrical noise deteriorating print quality occurs at one of the driver elements, the noise is propagated to other driver elements through the heatsink. According to the first embodiment of the invention, the undesirable noise propagation is prevented.

As shown in FIGS. 7 and 8, the heatsink 27 and the back wall 18b of the head holder 18 are spaced from each other by the predetermined distance (e.g., 3 mm) (as a first clearance), and the heatsink 27 and the circuit board 26 is also spaced from each other by the predetermined distance (e.g., 3 mm) (the second clearance). It is configured such that the second clearance is open to the atmosphere in its opposite ends in the direction of movement of the carriage 8, as well as in its upper end as the head holder is mounted on the carriage 8. Therefore, when the carriage 8 is reciprocated in the lateral direction, the air flows into the second clearance from one of the opposite ends in the direction of movement of the carriage 8 and out to the atmosphere from the other of the opposite ends, that is, the air passes through the each clearance in a substantially lateral direction, since the planar surface of the heatsink 27 is parallel to the reciprocating direction. The airflow thus generated in the vicinity of the surface of the heatsink 27 efficiently cools the heatsink 27 which has a relatively high temperature due to the heat generated by the IC chips 35-38. Further, the air passes through the second clearance in a substantially vertical direction, too, since the air which has become light by drawing heat from the heatsink 27 to have a higher temperature and expand, goes upward along the heatsink 27. Hence, even when the carriage 8 is stationary, the heatsink 27 is efficiently cooled.

Figure 9:
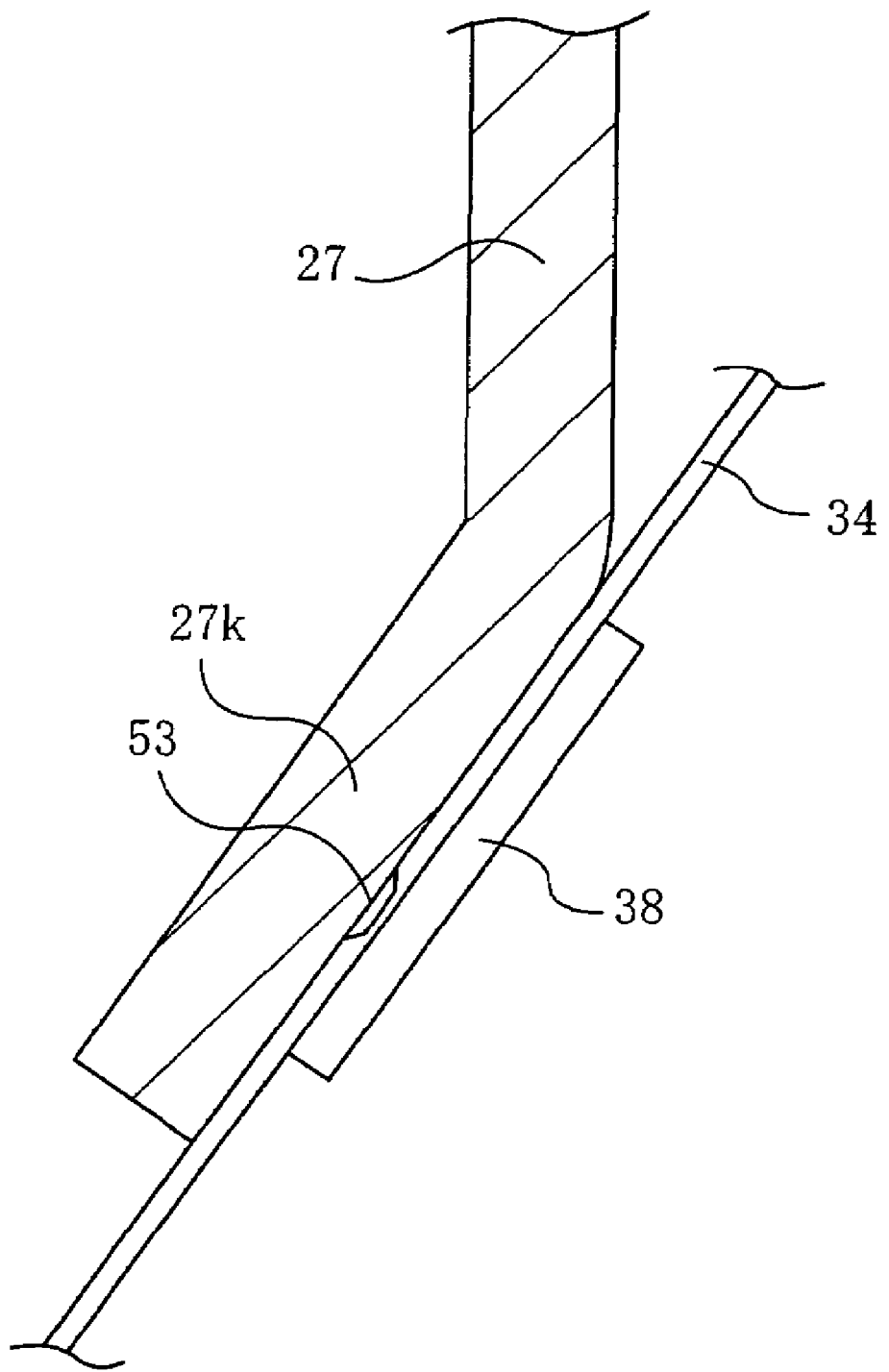
FIG. 9 is an enlarged cross-sectional view showing a foreign material introduced between the heatsink and a flexible wiring board.

There will be described a case where a foreign material 53 is introduced between the heatsink 27 and the flexible wiring board 34 on which the IC chip 38 is mounted, by reference to FIGS. 8 and 9. As shown in these drawings, in the ink jet printer 1 constructed as described above, the flexible wiring board 34 made of a resin (e.g., polyimide resin) having a high heat conductivity and being flexible and insulative is interposed between the contact portion 27k of the heatsink 27 and the IC chip 38. Therefore, even if the foreign material 53 is introduced between the contact portion 27k and the flexible wiring board 34, the flexible wiring board 34 yields and the foreign material 53 sinks into or sticks in the flexible wiring board 34, so that no local force acts on the IC chip 38. Thus, damage of the IC chip 38 due to the introduction of the foreign material 53 can be prevented.

As described above, in the ink jet printer 1 according to the first embodiment of the invention, the heatsink 27 serving to release, into the atmosphere, the heat generated at the IC chips 35-38 driving the plate-type piezoelectric actuators of the respective printing heads 19-22, is adapted to extend from the vicinity of the connecting portion of the first wall and the second wall of the head holder to the position between the back wall 18b of the head holder 18 and the circuit board 26. Accordingly, a total surface area (and therefore a total volume) of the heatsink 27 is enlarged in comparison with the conventional heatsink, for thereby enhancing the heat release effect. Thus, stable operation of the printing head is assured. Since recesses 27a-d are formed in the surface of the heatsink 27 opposite the circuit board 26, so as to avoid interference with parts including the legs of the electronic components soldered to the circuit board 26, undesirable contact of the heatsink 27 with the legs of the electronic components or other parts disposed on the surface of the circuit board 26 on the side of the heatsink 27 can be prevented. Further, since the heatsink 27 is spaced away from each of the back wall 18a of the head holder 18 and the circuit board 26 by each predetermined distance, the heat release from the heatsink 27 is not hindered.

Further, even if the foreign material 53 exists between the contact portion 27k of the heatsink 27 and the flexible wiring board 34, the foreign material 53 sinks or sticks in the wiring substrate 34 and the IC chip 38 can be held in close contact with the contact portion 27k via the flexible wiring board 34. Therefore, heat conduction from the IC chip 38 to the heatsink 27 is effectively enhanced. Further, the arrangement where the flexible wiring board 34 which is insulative is interposed between the outer surface of the IC chip 38 and heatsink 27 while the resin cover 24 or the sponge member 50 is also insulative, prevents the electrical noise generated at the IC chip 38 and deteriorating print quality, from being transmitted to other IC chips 35-37.

Figure 10:
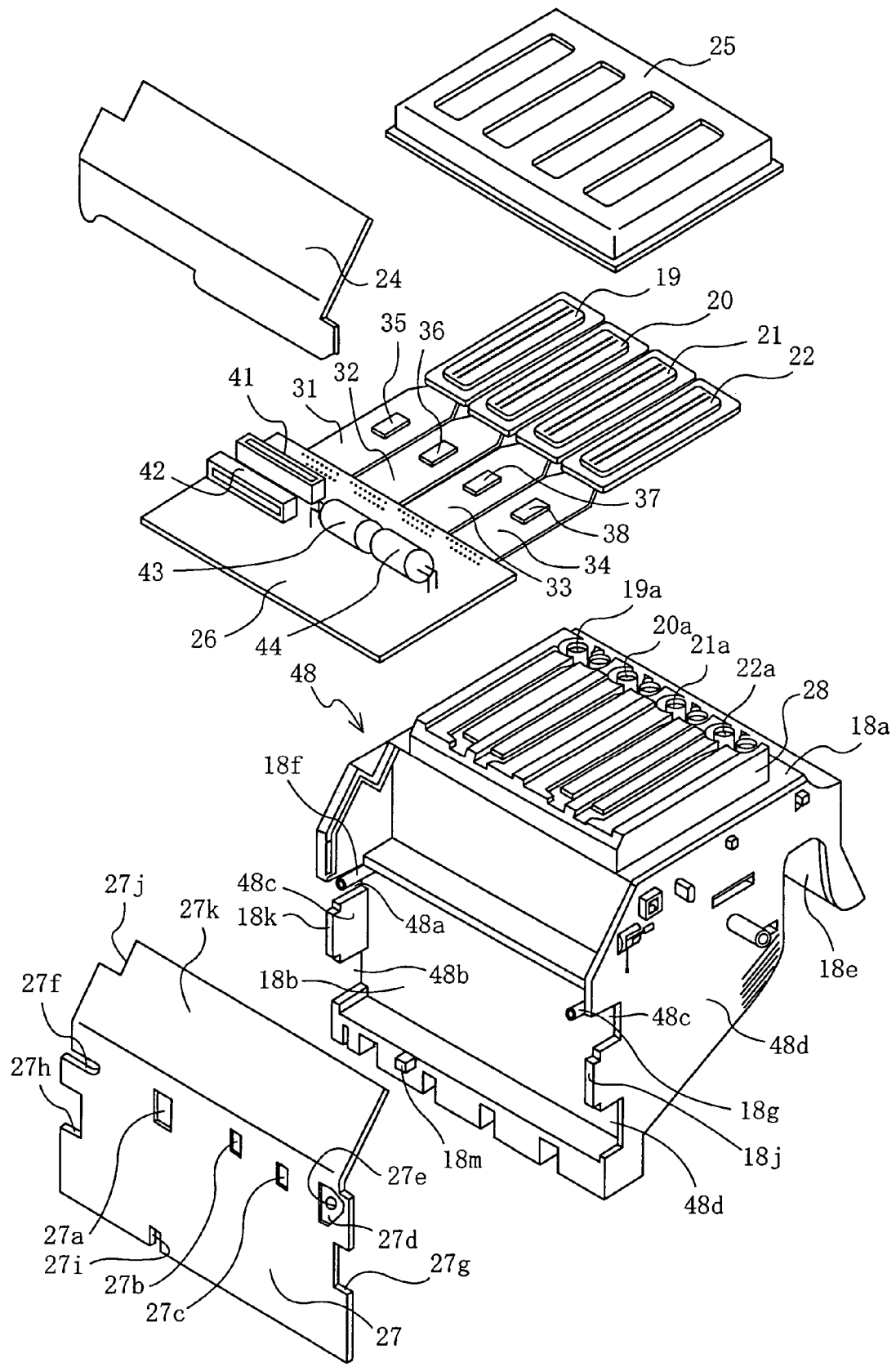
FIG. 10 is an exploded perspective view of a head unit according to a second embodiment of the invention.

There will next be described a head unit 48 according to a second embodiment of the invention, as shown in FIG. 10. The elements corresponding to those in the first embodiment are referred to by the same reference numerals and description thereof is omitted. In FIG. 10, a head holder 48 has cutouts 48a, 48b formed in a left wall 48c and cutouts 48c, 48d formed in a right wall 48d of the head holder 48. More specifically described, the cutouts 48a, 48b are formed in the left wall 48c on the upper and lower sides of the projection 18k, respectively, while the cutouts 48c, 48d are formed in the right wall 48d on the upper and lower sides of the projection 18j, respectively. Although the four cutouts 48a-d are formed in the left and right walls 48c, 48d, the projections 18*j*, 18*k*, 18*m* identical with those in the first embodiment are formed in the corresponding positions here in the second embodiment also, and function in the same way when the heatsink 27 is bonded to the head holder 18. According to the second embodiment, not only the second clearance but the first clearance is also held in communication with the atmosphere. More specifically described, similarly to that in the first embodiment, the second clearance is open to the atmosphere in its opposite ends in the direction of movement of the carriage 8 and also in its upper end. In the second embodiment, the cutouts 48*a*-*d* are formed such that the first clearance is also open to the atmosphere, in its opposite ends in the direction of the movement of the carriage 8. This further improves the airflow in the vicinity of the heatsink 27 having a relatively high temperature during the drive of the carriage 8, thereby enabling a highly efficient release of the heat outward from the heatsink 27.

While the preferred embodiments of the present invention has been described above, for illustrative purpose only, it is to be understood that the invention is not limited to the details of the illustrated embodiments, but may be embodied with various changes, modifications and improvements, which may occur to those skilled in the art, without departing from the spirit and scope of the invention defined in the attached claims. For example, although the plate-type piezoelectric actuator is used in the printing head in the printer 1 according to the above-described embodiment, the invention may be applied to various printers as long as the printer includes a driver element for driving a printing head. Further, the number of driver elements for driving the printing heads is not limited to four, but may be two, six or other numbers.

What is claimed is:

1. A recording apparatus comprising:
a printing head which has a plurality of recording elements and performs recording on a recording medium;
a head holder which holds the printing head and moves with the printing head in a direction;
a flexible wiring board which is disposed on the outer side of the head holder and comprises: a flexible insulating band; a plurality of conductive wires; and a driver element for actuating the printing head, the conductive wires and the driver element being disposed on the flexible insulating band; and
a heatsink for releasing heat generated by the driver element, the heatsink being disposed between the flexible wiring board and the head holder such that the heatsink is spaced from the outer surface of the head holder with a first clearance therebetween, the first clearance being open to the atmosphere in its opposite ends in the direction of the movement of the head holder and the printing head.

2. A recording apparatus comprising:
a printing head which has a plurality of recording elements and performs recording on a recording medium;
a head holder which has a substantially L-shaped portion comprising a first wall supporting the printing head and a second wall substantially vertically extending from an edge of the first wall;
a flexible wiring board which is disposed on the outer side of the head holder and comprises: a flexible insulating band; a plurality of conductive wires; and a driver element for actuating the printing head, he conductive wires and the driver element being disposed on the flexible insulating band;
a relay circuit board which is disposed on the outer side of the second wall with a space therebetween, and to which the flexible wiring board is connected; and
a heatsink for releasing heat generated by the driver element, the heatsink being disposed between the flexible wiring board and the head holder and comprising a first portion disposed between the flexible wiring board and the head holder and a second portion extending from an edge of the first portion into a space other than between the flexible wiring board and the head holder, the first portion of the heatsink extending from the vicinity of a connecting portion where the edge of the first wall and an edge of the second wall are connected, and the second portion of the heatsink extending into a space between the relay circuit board and the head holder.

3. The recording apparatus according to claim 2, wherein there is a first clearance between the heatsink and the outer surface of the head holder, and there is a second clearance between the heatsink and the relay circuit board.

4. The recording apparatus according to claim 3, wherein the head holder moves with the printing head in a direction, and the second clearance between the heatsink and the relay circuit board is open to the atmosphere in its opposite ends in the direction of the movement of the printing head and the head holder.

5. The recording apparatus according to claim 2, wherein:
the flexible wiring board connects the printing head fixed to the first wall and the relay circuit board which is spaced from the second wall and is substantially parallel to the second wall, the flexible wiring board including a slant portion which obliquely extending at a blunt angle with both the first wall and the second wall and on which the driver element is fixed; and
the first portion of the heatsink serves as a contact portion and is held in contact with the surface of the flexible insulating band which surface is opposite to the another surface of the flexible insulating band on which the driver element is disposed, at the position corresponding to the position in the another surface on which the driver element is disposed, and the second portion of the heatsink extends from the edge of the first portion on the side of the relay circuit board into the space between the second wall and the relay circuit board.

6. The recording apparatus according to claim 2, wherein the second wall extends substantially vertically in a direction opposite to the direction of the gravity from the first wall, and the heatsink extends in the same direction from the vicinity of the connecting portion of the edge of the first wall and the edge of the second wall, in substantially parallel to the second wall.

7. The recording apparatus according to claim 2, wherein the heatsink is directly held in close contact with a surface of the flexible insulating band which surface is opposite to another surface of the flexible insulating band on which the driver element is disposed, at a position corresponding to a position in the another surface where the driver element is disposed.

8. The recording apparatus according to claim 2, wherein the head holder moves with the printing head in a direction, and the recording on the recording medium by the printing head is performed while the printing head and the head holder are moving in the direction, and the heatsink is spaced from the outer surface of the head holder with a first clearance therebetween, the first clearance being open to the atmosphere in its opposite ends in the direction of the movement of the printing head and the head holder.

9. The recording apparatus according to claim 2, further comprising:
a cover which is disposed on a side of the flexible wiring board opposite to the head holder, and protects the flexible wiring board; and an elastic member provided between the driver element and the cover, the driver element being pressed toward the heatsink by a pressing force of the elastic member.

10. The recording apparatus according to claim 2, wherein a portion of one of two opposite surfaces of the heatsink, which surface is opposed to the head holder and on the side opposite to the flexible wiring board, is not in contact with the head holder, the portion of the surface of the heatsink comprising a first area corresponding to the driver element and a second area surrounding and adjacent to the first area.

11. A recording apparatus comprising:
a printing head which has a plurality of recording elements and performs recording on a recording medium;
a head holder which holds the printing head;
a flexible wiring board which is disposed on the outer side of the head holder and comprises: a flexible insulating band; a plurality of conductive wires; and a driver element for actuating the printing head, the conductive wires and the driver element being disposed on the flexible insulating band;
a heatsink which is disposed between the flexible wiring board and the head holder and releases heat generated by the driver element;
a cover which is disposed on a side of the flexible wiring board opposite to the head holder, and protects the flexible wiring board; and
an elastic member provided between the driver element and the cover such that the driver element is pressed toward the heatsink by a pressing force of the elastic member;
wherein the heat generated by the driver element is conducted to the heatsink to be dissipated inside the cover.

12. The recording apparatus according to claim 11, wherein a portion of one of two opposite surfaces of the heatsink, which surface is opposed to the head holder and on the side opposite to the flexible wiring board, is not in contact with the head holder, the portion of the surface of the heatsink comprising a first area corresponding to the driver element and a second area surrounding and adjacent to the first area.

13. The recording apparatus according to claim 11, wherein the heatsink is formed of a metal and the cover is formed of a resin.

14. A recording apparatus comprising:
a printing head which has a plurality of recording elements and performs recording on a recording medium;
a head holder which holds the printing head;
a flexible wiring board which is disposed on the outer side of the head holder and comprises: a flexible insulating band; a plurality of conductive wires; and a driver element for actuating the printing head, the conductive wires and the driver element being disposed on the flexible insulating band;
a heatsink for releasing heat generated by the driver element, the heatsink being disposed between the flexible wiring board and the head holder such that the heatsink is directly held in close contact with a surface of the flexible insulating band which surface is opposite to another surface of the flexible wiring board on which the driver element is disposed, at a position corresponding to a position in the another surface where the driver element is disposed;
a cover which is disposed on a side of the flexible wiring board opposite to the head holder, and protects the flexible wiring board; and an elastic member provided between the driver element and the cover, such that the driver element is pressed to the heatsink via the flexible insulating band, by a pressing force of the elastic member wherein the heat generated by the driver element is conducted to the heatsink to be dissipated inside the cover.

15. A recording apparatus comprising:
a printing head which has a plurality of recording elements and performs recording on a recording medium;
a head holder which holds the printing head;
a flexible wiring board which is disposed on the outer side of the head holder and comprises: a flexible insulating band; a plurality of conductive wires; and a driver element for actuating the printing head, the conductive wires and the driver element being disposed on the flexible insulating band; and
a heatsink for releasing heat generated by the driver element, the heatsink being disposed between the flexible wiring board and the head holder such that the heatsink is directly held in close contact with a surface of the flexible insulating band which surface is opposite to another surface of the flexible wiring board on which the driver element is disposed, at a position corresponding to a position in the another surface where the driver element is disposed, a portion of one of two opposite surfaces of the heatsink, which surface is opposed to the head holder and on the side opposite to the flexible wiring board, being separated from the head holder with a clearance to dissipate the heat conducted from the driver element via the flexible insulating band into the clearance, not in contact with the head holder, and the portion of the surface of the heatsink comprising a first area corresponding to the driver element and a second area surrounding and adjacent to the first area.

* * * * *